United States Patent
Guran et al.

(10) Patent No.: US 6,270,362 B1
(45) Date of Patent: *Aug. 7, 2001

(54) HIGH DENSITY SURFACE MOUNT CONNECTOR

(75) Inventors: Orest D. Guran; Donald E. Wood; Richard J. Middlehurst, all of Fremont, CA (US)

(73) Assignee: Berg Technology, Inc., Reno, NV (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/206,842

(22) Filed: Dec. 7, 1998

Related U.S. Application Data

(60) Division of application No. 08/631,701, filed on Apr. 10, 1996, now Pat. No. 5,850,693, which is a continuation-in-part of application No. 08/381,785, filed on Jan. 31, 1995, now abandoned.

(51) Int. Cl.[7] .............................. H01R 9/09; B65D 73/02
(52) U.S. Cl. .............................. 439/83; 206/728; 439/876
(58) Field of Search .................. 439/78, 83, 590, 439/876, 206; 206/328, 329

(56) References Cited

U.S. PATENT DOCUMENTS

| | | | |
|---|---|---|---|
| 4,236,776 | * 12/1980 | Wellington | 439/83 |
| 4,442,938 | * 4/1984 | Murphy | 439/83 |
| 4,581,678 | * 4/1986 | Chambers | 439/83 |
| 4,631,639 | * 12/1986 | Biraud | 439/83 |
| 4,934,944 | 6/1990 | Kozel et al. | 439/68 |
| 5,147,209 | 9/1992 | Litwin et al. | 439/70 |
| 5,279,028 | * 1/1994 | McKee et al. | 439/83 |
| 5,501,612 | * 3/1996 | Green | 439/936 |
| 5,609,496 | * 3/1997 | Kilmer et al. | 439/936 |

* cited by examiner

Primary Examiner—Hien Vu
(74) Attorney, Agent, or Firm—Brian J. Hamilla; M. Richard Page; Steven M. Reiss

(57) ABSTRACT

An electronic socket adapter includes an insulative carrier and an array of a plurality of surface mount contacts carried on the base. The pins may be floatably mounted on the carrier. A plurality of relatively large openings are formed in the carrier between adjacent contacts in the array. The openings provide improved heat flow in the region of the surface mount portions of the contacts and also provide for visualization of the surface mount portions of the contacts during and after soldering.

15 Claims, 4 Drawing Sheets

HIGH DENSITY SURFACE MOUNT CONNECTOR

This application is a division of application Ser. No. 08/631,701, filed Apr. 10,1996 now U.S. Pat. No. 5,850,693 which was a continuation-in-part of application Ser. No. 08/381,785 filed Jan. 31, 1995 abandoned and having an effective filing date of Sept. 14, 1994.

BACKGROUND OF THE INVENTION

1. Field of the Invention

This invention relates to electrical connectors. The invention specifically relates to surface mount electrical connectors.

2. Reported Developments

For many years electronic component manufacturers employed through hole mounting techniques for securing electrical components, such as electrical connectors, to printed circuit boards (PCB). One of these techniques employs board mounted components with contact tails that extend through contact apertures in the PCB from a component mounting side of the PCB to an opposed, solder-receiving side of the underside of the PCB. For high volume production, wave soldering is used to solder the contact tails to the PCB.

Recently, surface mounting techniques have been developed for mounting components onto PCB's. Surface mounting involves soldering contact tails to contact pads on the component-receiving side of the PCB. This eliminates the need for through holes and allows the mounting of components on both sides of the PCB. Usually, the technique involves placing a soldering paste on the contact pads of the PCB, placing the solder tails of the components in the soldering paste, and then effecting soldering by reflowing the soldering paste by passing the PCB through a convection or infra red heating process. Visibility of the solder tails is desirable so that the solder joint can be visually inspected and repaired by re-soldering, if defective. These requirements have been addressed in the past by having the solder tails extend laterally outwardly beyond the edges of the component being mounted on the PCB. An undesirable aspect of such arrangements is that a significant amount of space on the PCB must be devoted to the overall footprint of the component, thereby reducing the density of components on the available surface area of the PCB.

One approach to this situation has been to locate the solder tails along interior edge portions of the component body and to provide windows in an overlying portion of the component body that carries no contacts. An example of such a construction is shown in U.S. Pat. No. 4,934,944. A disadvantage of this design is that it requires the contact solder tails to be bent, so as to be located out of the field of the contact array.

SUMMARY OF THE INVENTION

According to the invention, high density surface mount components, such as adapters having pin grid arrays, provide improved contact solderability and visualization for inspection and repair. These characteristics result from use of a carrier having an extensive array of relatively large size openings disposed between adjacent contacts. The contacts can be straight-through pins that are floatably mounted in the base.

DETAILED DESCRIPTION OF THE PREFERRED EMBODIMENT

Figure 1:
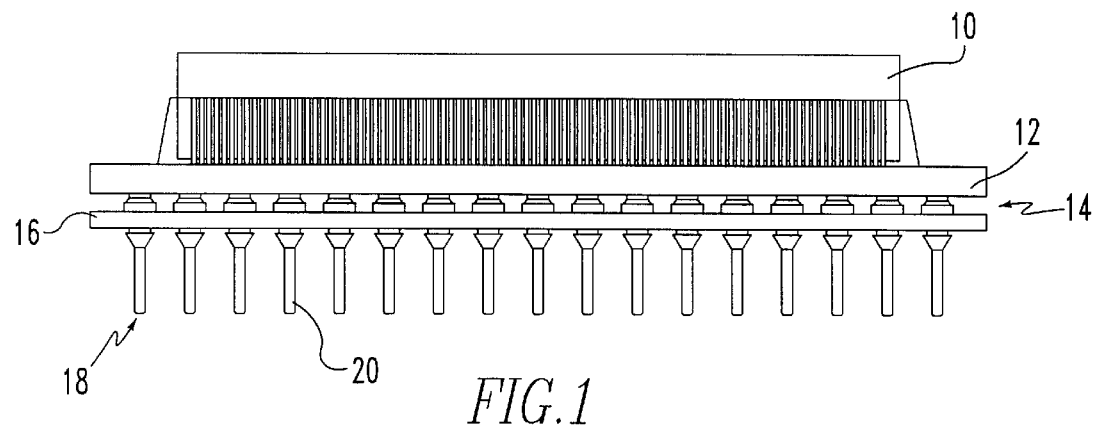
FIG. 1 is a side view of pin grid array adapter, according to the invention, positioned for use.
Figure 2:
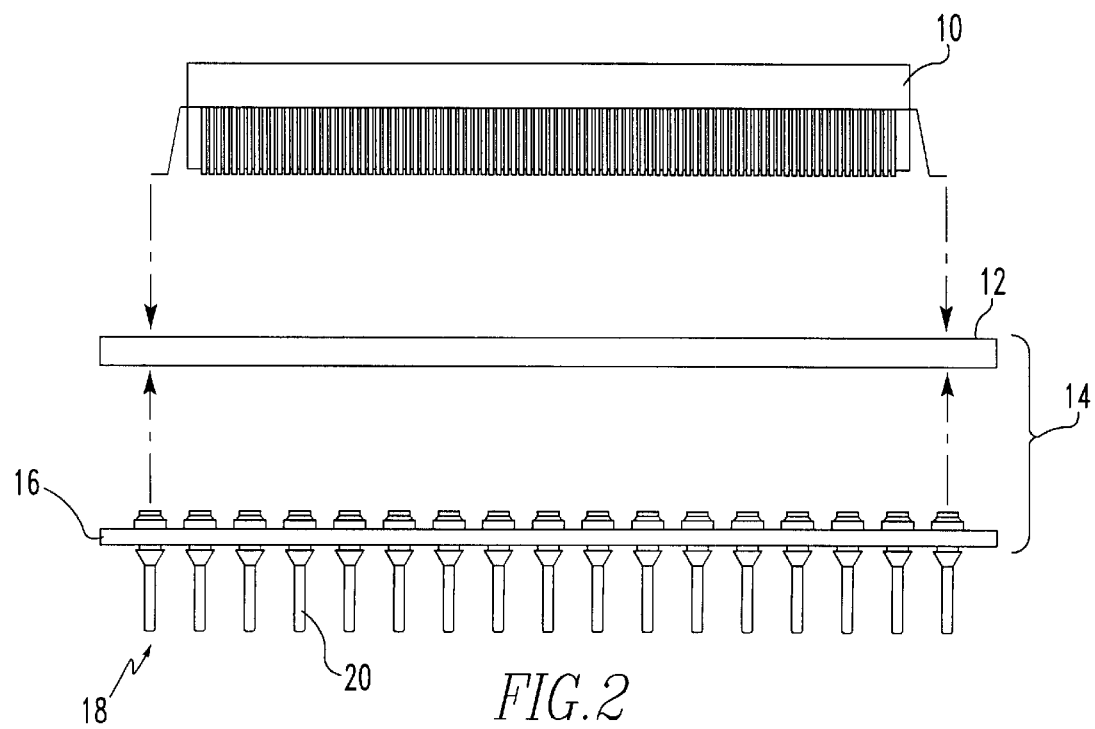
FIG. 2 is an exploded view of the elements shown in FIG. 1.
Figure 2A:
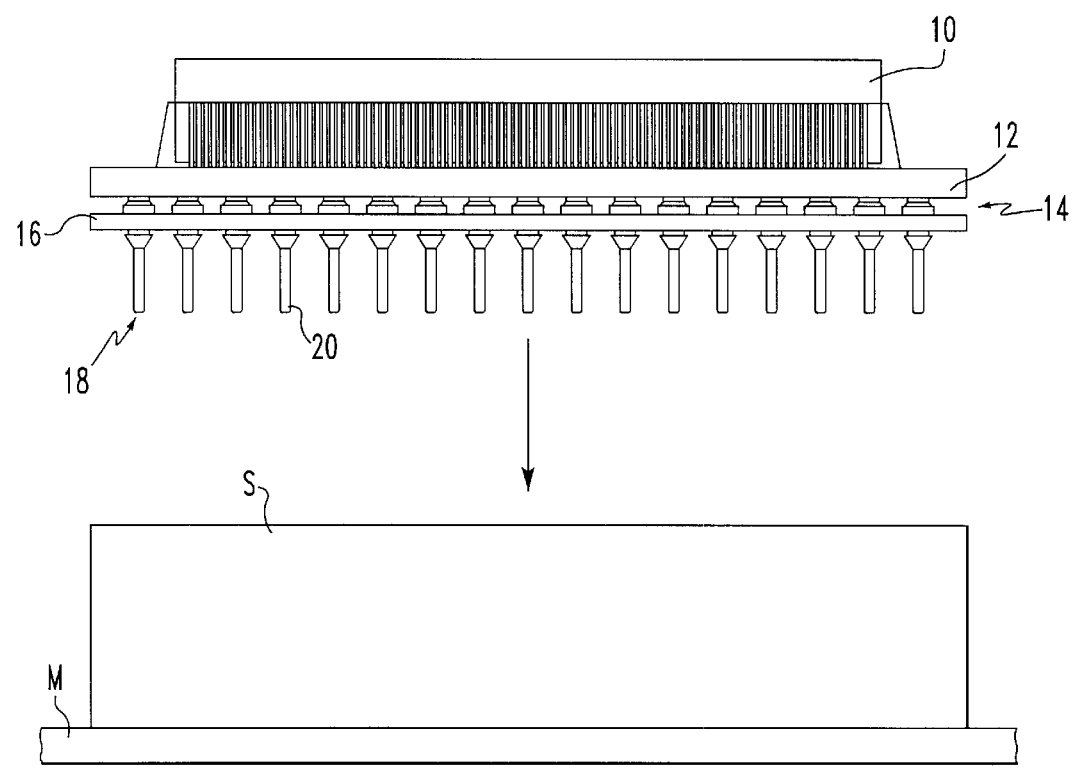
FIG. 2A is a side view of the adapter shown in FIG. 1 before mounting to a socket on a motherboard.

FIG. 1 illustrates one example of an electrical component according to the invention. In this arrangement, a known type of socket or device 10, for example, a quad flat pack (as shown), is surface mounted on one side of an intermediate PCB 12. The socket 10 can receive an electronic component such as a leadless or leaded IC chip (not shown) and serves to mechanically hold the IC chip onto the PCB 12 and electrically connect its leads to contact pads on PCB 12. Alternatively, a device 10, such as an IC chip or like component can be directly mounted, without a socket, on PCB 12. The IC chip or component can, for example, be a leaded device or one utilizing ball grid array techniques for attachment to PCB 12.

An adapter 14 comprises PCB 12 and a generally planar base or carrier 16 and an array formed of a plurality of contacts 18 which are surface mounted on the side of PCB 12 opposite to the side on which socket(s) or device(s) 10 is mounted. Pin portions 20 of the contacts 18 extend substantially perpendicularly from the bottom surface of the carrier 16. These pin portions are capable of being received in a second type of socket S such as a pin grid array socket mounted in a motherboard or base circuit board, M, for example. The adapter allows a non-pin-grid array type device to be converted into a pin grid array format, thereby facilitating mounting and removal of the IC chip from a pin grid array socket on the motherboard that ultimately receives the chip. This in turn provides a system for allowing a motherboard to be upgraded with a different IC chip at a relatively low cost.

The carrier 16 is formed of an insulative material having a high dielectric constant. The carrier can be formed by molding of suitable thermoplastic resins, such as polyphenylene sulfide ("PPS"), or liquid crystal polymer. The carrier 16 can also be formed from rigid, planar sheet material, such as FR4, a glass fiber filled epoxy printed circuit board material, or other printed board materials.

Figure 3:
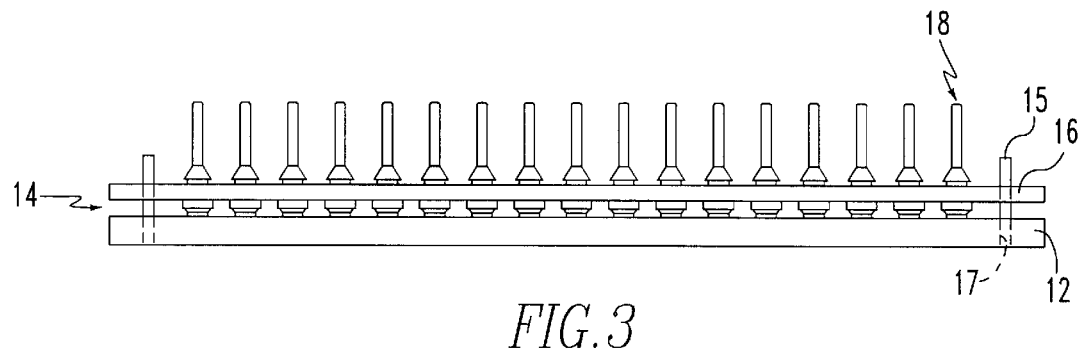
FIG. 3 is a side view of an adapter embodying the invention mounted on a PCB.

As shown in FIG. 3, the adapter 14 is formed by surface mounting the carrier 16 with the surface mount heads 22 of the contacts 18 (FIG. 5) engaging contact pads (not shown) on the PCB 12. As is conventional, the carrier 16 may be located on PCB 12 by means of alignment pegs 15 that are received in location holes 17 in the PCB. Each head 22 includes a tapered portion 24 leading into a contact pad engagement portion 26. The contact pad engagement portions 26 are pushed into deposits of solder paste (not shown) that have been previously placed on PCB 12 at the location of the contact pads. After a reflow soldering step, carried out by IR or convection heating or a combination of them, a solder fillet 28 is formed to effect electrical continuity between contact 18 and the contact pad of the PCB and to secure the adapter mechanically onto the PCB 12. It should be realized that the contact pads on the PCB 12 to which the contacts 18 are soldered are connected by suitable circuit traces on and/or through the PCB 12 to contacts on the opposite side of the PCB 12 to which terminals of a device 10 or other components are to be soldered.

Figure 5:
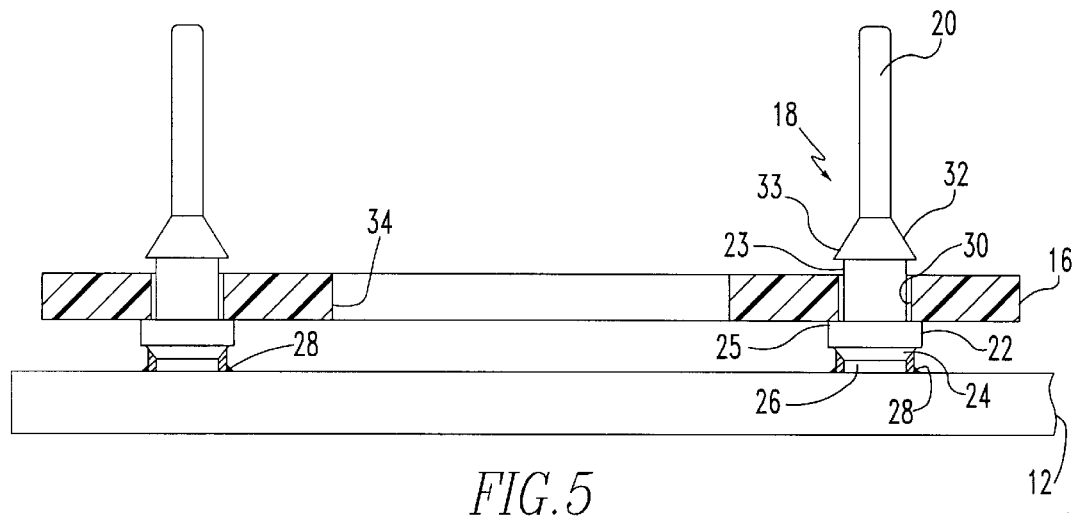
FIG. 5 is a side cross sectional view of a component illustrated in FIG. 4.

As shown in FIG. 5, the contacts 18 are retained in a contact-receiving aperture 30 in the carrier 16. The contacts are floatingly mounted on carrier 16 by having the outside diameter of the intermediate portion 23 of the contact slightly smaller than the inside diameter of the aperture 30. A retention element, such as the frusto-conical section 32 formed on contact 18, retains each contact 18 in the carrier 16. The intermediate portion 23 extends between the shoulder 25 of the contact head 22 and the shoulder 33 of retention element 32 an axial distance greater than the thickness of the base 16, thereby allowing the contacts 18 to move or "float" with respect to carrier 16. The floating mounting of contacts 18 allows for compensation for non-coplanarity between PCB 12 and base 16. In the foregoing description, the contact 18 is basically a cylindrical pin, the contours of which formed by rotation of the pin about its longitudinal axis. However, the contact 18 could have other cross sectional shapes. In the embodiment shown, the contacts 18 are mounted in the carrier 16 by inserting the pin portions 20 through the apertures 30 and then forcibly pushing the frusto-conical retaining sections 32 through the apertures, to retain the contacts 18 on carrier 16.

Figure 4:
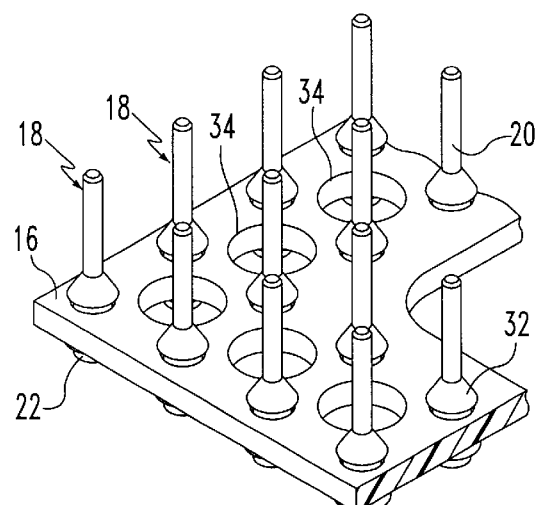
FIG. 4 is a fragmentary isometric view of a surface mount component according to the invention.
Figure 6:
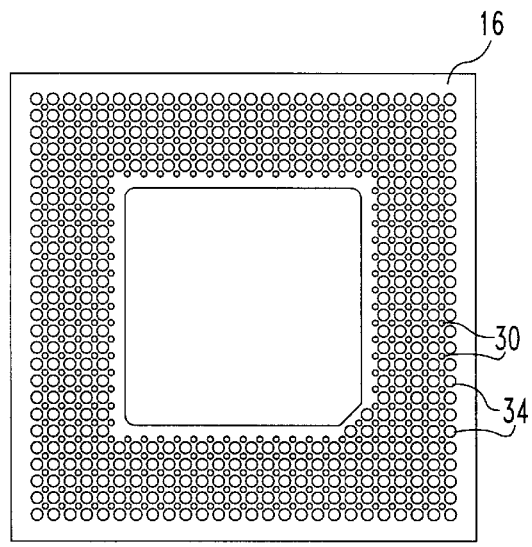
FIG. 6 is a plan view of a base of an adapter embodying the invention.

As shown in FIGS. 4 and 6, the base 16 includes an array of larger openings 34, which are disposed over substantially all the area of the carrier 16 where contacts 18 are located. The openings 34 are relatively large with respect to the receiving aperture 30. For example, the ratio of the diameter or transverse extent of the openings 34 to the diameter of apertures 30 can range for about 2:1 to about 4:1; depending on the desired pitch of contacts 18. In one embodiment, a ratio of 3:1 has been found to yield desired results. Although the openings 34 are illustrated in the preferred embodiment as round, they could be formed in other shapes. As illustrated in FIG. 6, the openings 34 can be arranged interstitially with respect to contact apertures 30, especially when high contact densities are required. The openings 34 provide for visualization of the solder joints formed at the head 22 of each of the contacts 18, so that the quality of the solder point can be ascertained.

The openings are large enough so that hand repair of the joints at selected locations can be made. Most importantly, it has been found that the addition of openings 34 in the base 16 provide for substantially improved solder joint integrity resulting both in the reduction of poor solder joints and in an increase in the retention force between carrier 14 and the PCB 12.

Figure 7:
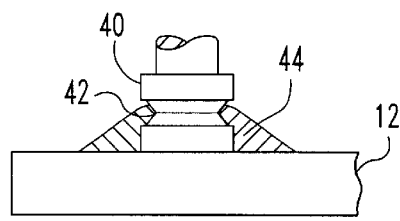
FIG. 7 is a fragmentary view of a second embodiment of surface mount contact.

Another embodiment of pin 20 is shown in FIG. 7. The head 40 of the pin has a circumferential groove 42, which may be V-shaped as shown. The groove is located so that at least a portion of the solder fillet 44 will enter the groove. This arrangement increases the retention force between the pin and PCB 12.

The invention provides a high density surface mount component with high solder joint reliability. The provision of openings in the base is believed to contribute substantially to this result by lessening heat shadowing and allowing free flow of heat by convection to and from the solder locations.

Adapters of the type disclosed provide for the mounting of high lead count components with a double surface mount arrangement that minimizes space requirements. The component is surface mounted onto one side of intermediate PCB 12 and the carrier 16, in turn, is surface mounted on the opposite side of the intermediate PCB 12. Thus, there is no need to use through hole connections to PCB 12, that have relatively larger space requirements, especially in high pin count situations. The pin portions 20 can be received in conventional socket devices, such as a pin grid array or socket connector (not shown), for removable connection to a motherboard (not shown). This approach also avoids the need for constructing multi-chip modules, on a single ceramic substrate which requires a large number of contact pins to be brazed or otherwise affixed to this ceramic substrate. Such components are expensive and difficult to produce. The disclosed mounting arrangement provides removability of a high lead count component with a relatively low cost adapter comprising the PCB 12 and carrier 16.

What is claimed is:

1. A carrier (16) for surface mounting a plurality of contacts to a circuit substrate (12), each contact having a surface mounting portion (22) to engage the circuit substrate and an opposed mating portion, the carrier formed of an electrically insulative material and comprising:

a first side facing the circuit substrate;

a second side opposed to the first side;

a plurality of contact receiving apertures (30) arranged in an array through the carrier, wherein each of said contacts is adapted to extend through a respective one of said apertures to engage the circuit substrate, with said surface mounting portions disposed adjacent said first side of the carrier and engaging the circuit substrate, said mating portions extending from said second side of the carrier so that the contacts are floatably mountable to said carrier;

a plurality of inspection openings (34) in the carrier disposed in a pattern interspersed between a plurality of apertures;

wherein each of said openings are located between four adjacent apertures and are at least approximately twice as large as said apertures to allow inspection of solder joints between the surface mounting portions of the contacts and the circuit substrate from said second side of the carrier.

2. The carrier according to claim 1, wherein the ratio of the transverse extent of the openings to the transverse extent of the contact receiving apertures is from about 2:1 to about 4:1.

3. The carrier as recited in claim 1, wherein the carrier comprises a substantially planar member, said contact receiving apertures are disposed in a regularly spaced array in said planar member and said openings are disposed in a regular pattern extending substantially between the contact receiving apertures.

4. The component as recited in claim 1 wherein said carrier is generally rigid.

5. The component as recited in claim 4, wherein said carrier is one of a thermoplastic resin and a thermosetting resin.

6. The carrier as recited in claim 1, in combination with the plurality of contacts, said contacts mounted to said apertures.

7. The carrier as recited in claim 1, wherein said apertures form at least three rows, and said openings reside between each of said rows.

8. An adapter (14) for removably mounting an electronic device (10) on a base circuit board (M) comprising:

an intermediate circuit board (12) positioned between the electronic device and the base circuit board, the intermediate circuit board having:
  a first side for receiving the electronic device; and
  a second side;
a carrier (16) made from an insulatve material, positioned adjacent to the second side of the intermediate circuit board, and having:
a first side;
  a second opposed side;
  a plurality of contact receiving apertures (30) arranged in an array through the carrier; and
  a plurality of inspection openings (34) in the carrier disposed in a pattern interspersed with the contact receiving apertures; and
an array of contact pins (18) mounted on the carrier and the intermediate circuit board, each having:
  a head portion (22) disposed on the first side of the carrier and surface mounted to the second side of the intermediate circuit board; and
  a pin portion (20) extending from the second side of the carrier;
  wherein each of said openings are located between four adjacent apertures and are larger than said apertures to allow inspection of solder joints between said contact pins and said intermediate circuit board from said second side of said carrier.

9. The adapter according to claim 8, wherein the head portions of the pins are surface mounted on the intermediate circuit board.

10. The adapter of claim 8, wherein the electronic device is an integrated circuit chip and said chip is mounted on said first side of said intermediate circuit board.

11. A mounting arrangement for an electronic device (10), comprising:

a circuit board (12) having a first side for receiving the device and a second side opposite the first side;
a carrier (16) formed from an electrically insulative material, located adjacent the second side of the circuit board, the carrier having:
  a first side;
  a second side;
  a plurality of contact receiving apertures (30) arranged in an array through the carrier, and
  a plurality of openings (34) in the carrier disposed in a pattern interposed with the contact receiving apertures; and
an array of contact pins (18) floatably mounted on the carrier, each pin having:
  a head portion (22) disposed on said first side of the carrier and mounted on the second side of the circuit board; and
  a pin portion (20) extending from the second side of the carrier;
wherein each of said openings are located between four adjacent apertures and are larger than said apertures to allow inspection of solder joints between said pins and said circuit board from said second side of said carrier.

12. The mounting arrangement of claim 11, wherein the head portions of the pins are surface mounted on the circuit board.

13. The mounting arrangement of claim 11, wherein the mounting arrangement can engage a pin grid array socket.

14. The mounting arrangement as recited in claim 11, wherein said pins remain mounted to said carrier after said pins mount to said circuit board.

15. The carrier as recited in claim 3, wherein the openings are interstitially arranged with respect to the contact receiving apertures.

* * * * *